15,672
United States Patent [19]

Miyashita et al.

[11] Patent Number: 5,332,683
[45] Date of Patent: Jul. 26, 1994

[54] METHOD OF MANUFACTURING SEMICONDUCTOR DEVICE HAVING ELEMENTS ISOLATED BY TRENCH

[75] Inventors: Naoto Miyashita, Yokohama; Koichi Takahashi; Hironori Sonobe, both of Kawasaki, all of Japan

[73] Assignee: Kabushiki Kaisha Toshiba, Kawasaki, Japan

[21] Appl. No.: 15,672

[22] Filed: Feb. 9, 1993

Related U.S. Application Data

[63] Continuation of Ser. No. 726,730, Jul. 2, 1991, abandoned, which is a continuation of Ser. No. 534,479, Jun. 7, 1990, abandoned.

[30] Foreign Application Priority Data

Jun. 14, 1989 [JP]  Japan .................................. 1-151542

[51] Int. Cl.$^5$ ................... H01L 21/265; H01L 29/70
[52] U.S. Cl. ........................................ 437/33; 437/67; 437/31; 257/506
[58] Field of Search ................... 437/67, 33, 31; 156/643, 644; 257/506

[56] References Cited

U.S. PATENT DOCUMENTS

| | | | |
|---|---|---|---|
| 4,454,647 | 6/1984 | Joy et al. | 156/643 |
| 4,473,598 | 9/1984 | Ephrath et al. | 156/643 |
| 4,631,803 | 12/1988 | Hunter et al. | 437/67 |
| 4,851,366 | 7/1989 | Blanchard | 437/67 |
| 4,871,689 | 10/1989 | Bergami et al. | 437/67 |
| 4,876,214 | 10/1989 | Yamaguchi et al. | 437/67 |
| 4,916,086 | 4/1990 | Takahashi et al. | 437/67 |
| 4,931,409 | 6/1990 | Nakajima et al. | 437/67 |
| 5,208,179 | 5/1993 | Okazawa | 437/67 |

FOREIGN PATENT DOCUMENTS 0078725  5/1983  European Pat. Off. .
0135354  3/1985  European Pat. Off. .

OTHER PUBLICATIONS

Patent Abstracts of Japan, Publication No. JP 60136327, Jul. 19, 1985.

*Primary Examiner*—Olik Chaudhuri
*Assistant Examiner*—Long Pham
*Attorney, Agent, or Firm*—Finnegan, Henderson, Farabow, Garrett & Dunner

[57] ABSTRACT

This invention relates to a method of manufacturing a semiconductor device having elements isolated by a trench. A trench is formed to surround an element region of a silicon substrate by anisotropic etching. A nonoxide film such as a silicon nitride film is selectively formed on the upper surface of the element region. Thermal oxidation is performed using the nonoxide film as a mask to form an oxide film on the inner face of the trench and the upper surface of a field region. Thereafter, a polysilicon layer is buried in the trench, and after the surface of the polysilicon layer is flattened, a capping oxide film is formed on the upper surface of the trench. In addition, a non-oxide film is formed to have an interval between the end of the nonoxide film and the trench of 2 μm or more.

3 Claims, 5 Drawing Sheets

METHOD OF MANUFACTURING SEMICONDUCTOR DEVICE HAVING ELEMENTS ISOLATED BY TRENCH

This application is a continuation of application Ser. No. 07/726,730, filed Jul. 2, 1991, now abandoned, which was a continuation of application Ser. No. 07/534,479, filed Jun. 7, 1990, now abandoned.

BACKGROUND OF THE INVENTION

1. Field of the Invention

The present invention relates to a method of manufacturing a semiconductor device such as a semiconductor integrated circuit having elements isolated by a trench.

2. Description of the Related Art

In a conventional semiconductor integrated circuit, a plurality of element regions electrically isolated from each other are arranged on a major surface of a semiconductor substrate. An active element such as a transistor and a passive element such as a resistor are formed on these element regions. The element regions are isolated from each other by a trench, a p-n junction, an oxide film, and the like. A prior art example wherein an integrated circuit is manufactured by an element isolation method using a trench will be described below.

As shown in FIG. 1, a trench 11 is formed to surround an element region 12 of an Si substrate 13 by anisotropic etching. A nonoxide film 14 such as a silicon nitride ($SiN_x$) film is selectively formed on the upper surface of the element region 12. Thermal oxidation is performed for the resultant structure using the nonoxide film 14 as a mask to form an oxide film 15 on the inner surface of the trench 11 and the upper surface of a field region 16. Thereafter, a polysilicon layer 17 is buried in the trench 11, and after the surface of the polysilicon layer 17 is flattened, a capping oxide film 18 is formed on the trench 11.

In order to improve integration of elements, an interval $W_{TL}$ between the end of the nonoxide film 14 and the first side wall (indicated by broken line in FIG. 1) of the trench 11 is generally designed to be minimized. The interval $W_{TL}$ is conventionally selected from the range of 0 μm to 1 μm. However, when the interval $W_{TL}$ is too small, dislocation defects 23 may be extended in the inside of the substrate from corner portions 21 of the upper portion of the trench 11 and corners 22 of the bottom by stress concentration upon formation of the oxide film 15 by thermal oxidation, as shown in FIG. 2.

The dislocation defects cause degradation of isolation characteristics between element regions and characteristics of elements formed on the element regions. For example, when a bipolar transistor is formed on each of the element regions, the presence of dislocation defects causes a leak current of each transistor to increase or causes various characteristics such as collector current (Ic) vs. current amplification factor ($h_{FE}$) characteristics to degrade. More specifically, when dislocation defects are present at a given density, a recombination current is increased using defects as the center of recombination, thereby degrading characteristics of the element or element isolation characteristics.

SUMMARY OF THE INVENTION

It is an object of the present invention to provide a method of manufacturing a semiconductor device wherein defects such as dislocations generated in a substrate are suppressed and element characteristics and element isolation characteristics are not substantially degraded.

According to the present invention, there is provided a method of manufacturing a semiconductor device, comprising the steps of: forming a trench in a monocrystalline silicon substrate to surround an element forming region by anisotropic etching, forming a nonoxide film on the element forming region such that an interval between an end portion of the nonoxide film and a side wall of each trench at a side near the element forming region of the trench is not less than 2 μm, and forming an oxide film having a thickness of less than 9,000 Å on a surface of the substrate including an inside of the trench using the nonoxide film as a mask during selective oxidation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
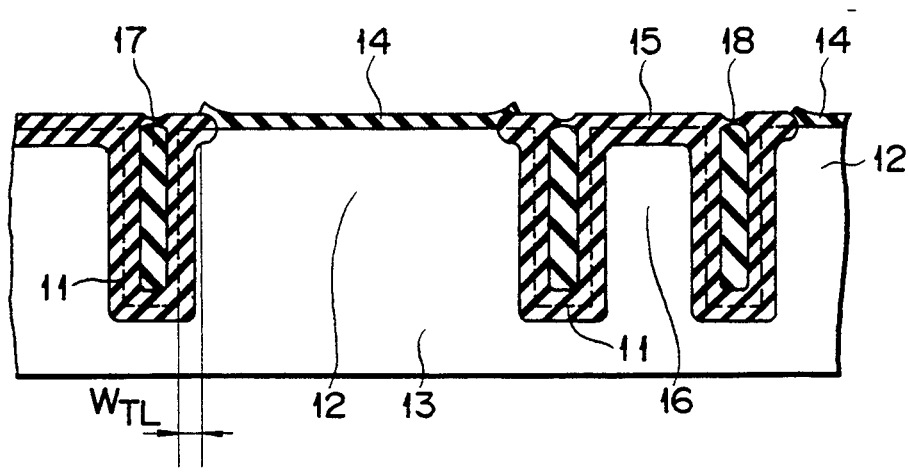
FIG. 1 is a sectional view showing an integrated circuit manufactured by a conventional method.
Figure 2:
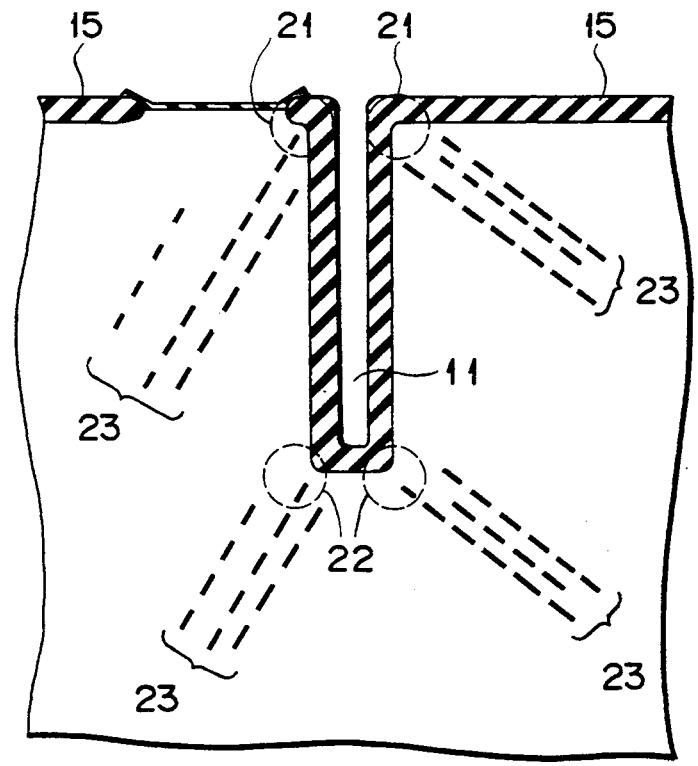
FIG. 2 is a sectional view for explaining a problem of the conventional manufacturing method.

The present inventors made extensive studies and obtained the following findings. That is, an element isolation structure using a trench is formed in the following manner. After a trench is formed in a semiconductor substrate, oxide films are simultaneously or independently formed in the trench and on the upper surface of a field region by thermal oxidation using a nonoxide film such as an $SiN_x$ film as a mask, and a dielectric material such as polysilicon is filled in the trench upon oxidation. Thereafter, the surface of the polysilicon is flattened, and the exposed surface of the dielectric material is oxidized to form a capping oxide film. In the element isolation structure, the density of defects such as dislocations extending from the corner of the trench mainly depends on an interval (interval $W_{TL}$ in FIG. 1) between the end of the nonoxide film and the first side wall of the trench. A density of defects such as dislocations extending from the corners of the trench also depends on the thickness of an oxide film formed on a field region or the inner surface of the trench. According to an attempt to be described later, the thickness of the oxide film formed by oxidizing the field region and the inner surface of the trench and the interval between the end of the nonoxide film and the first side wall of the trench are defined, thereby surely suppressing dislocation defects extending from the corners of the trench. Therefore, element characteristics and element isolation characteristics are not substantially degraded.

Figure 3A:
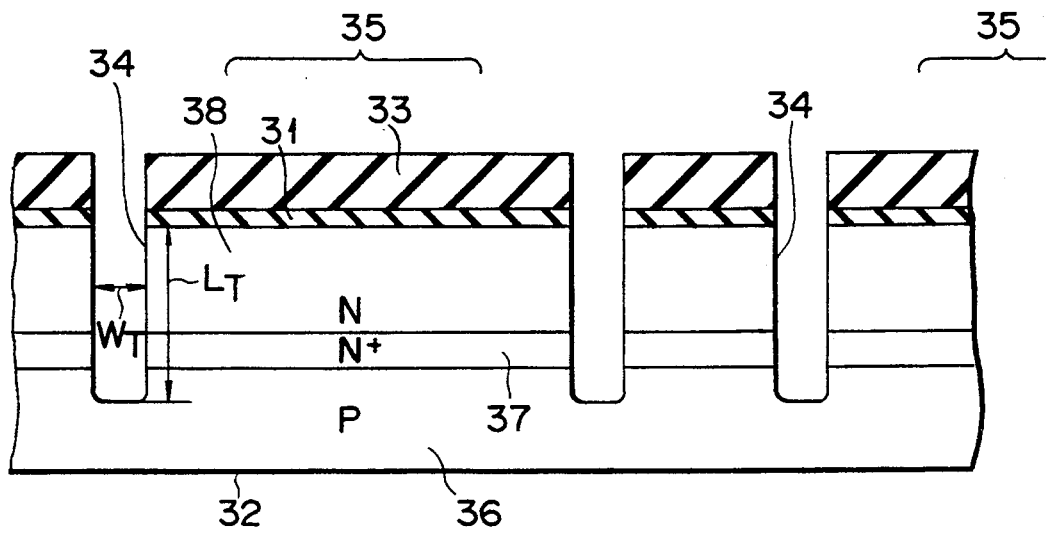
FIGS. 3A to 3C are sectional views showing steps in manufacturing an integrated circuit according to a method of the present invention.

As an embodiment of a method of manufacturing a semiconductor device of the present invention, a case wherein a bipolar transistor is formed in an element region will be described below. As shown in FIG. 3A, an SiO$_2$ film 31 having a thickness of 700 to 1,000 Å is formed on the major surface of a monocrystalline silicon substrate 32 by CVD or thermal oxidation. A resist pattern 33 having an opening on a region for forming a trench for isolating elements is formed in the SiO$_2$ film 31, and a plurality of trenches 34 each having a width $W_T$ of about 1 to 2 μm and a depth of about 5 μm are formed vertically in the substrate to surround a plurality of element regions 35. Note that the monocrystalline silicon substrate 32 is constituted by, e.g., a p-type epitaxial layer 36, an n$^+$-type buried layer 37 formed on the epitaxial layer 36, and an n-type layer 38 formed on the n$^+$-type buried layer 37.

Figure 3B:
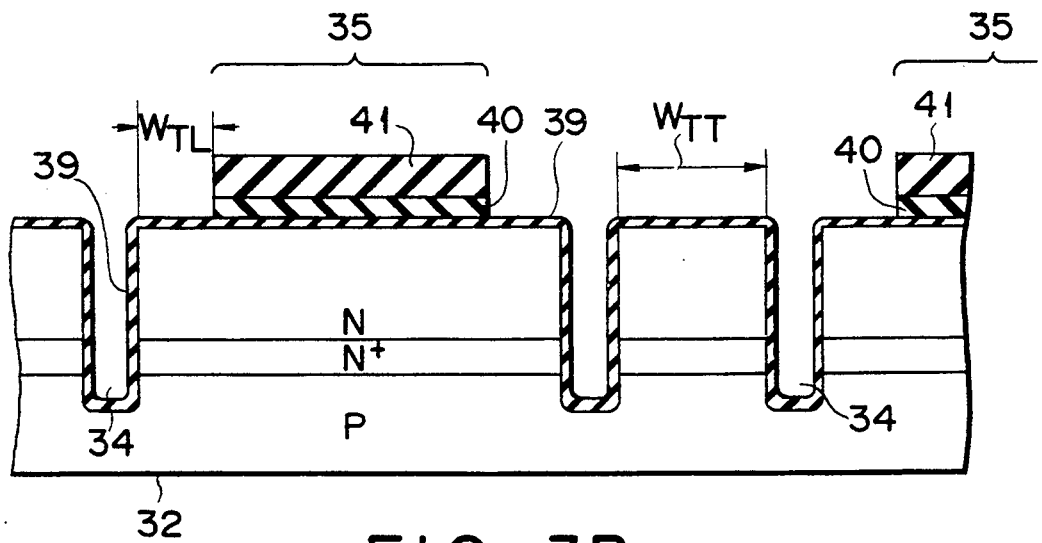

The resist pattern 33 is removed by, e.g., an O$_2$ asher, and the SiO$_2$ film 31 is removed by, e.g., diluted hydrofluoric acid. As shown in FIG. 3B, thermal oxidation is performed for the resultant structure in a gas mixture of H$_2$ and O$_2$ at a temperature of 950° C. to form an SiO$_2$ film 39 having a thickness of about 500 Å on the entire surface of the resultant structure. In addition, a 1,500 Å nonoxide film 40 such as a silicon nitride (SiN$_x$) film is deposited at a temperature of 780° C. by LP-CVD (Low Pressure-CVD). A resist pattern 41 is formed on the nonoxide film 40 by photoetching, and the nonoxide film 40 is plasma-etched to leave it on only the plurality of element regions 35. In this case, the device is designed to have an interval ($W_{TL}$ in FIG. 3B) having at least 2 μm or more between the end of the remaining nonoxide film 40 and a side wall of each trench 34 at a side near the element region 35. At the same time, the device is designed to have an interval ($W_{TT}$ in FIG. 3B) having about 3 μm between side walls of the adjacent trenches 34.

Figure 3C:
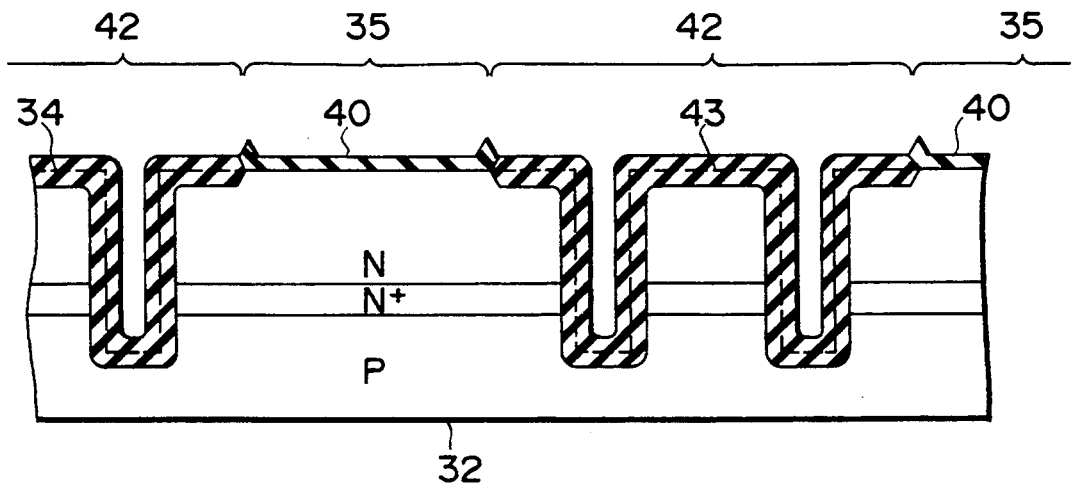

As shown in FIG. 3C, the resist pattern 41 is removed by, e.g., an O$_2$ asher in the same manner as described above, and wet oxidation is performed at a temperature of 1,000° C. using the nonoxide film 40 as a mask to continuously form, e.g., oxide films 43 each having a thickness of less than 9,000 Å, e.g., 8,000 Å, on field regions 42 respectively located between the element regions 35 and the trenches 34 and on the side walls of trenches 34.

Figure 3D:
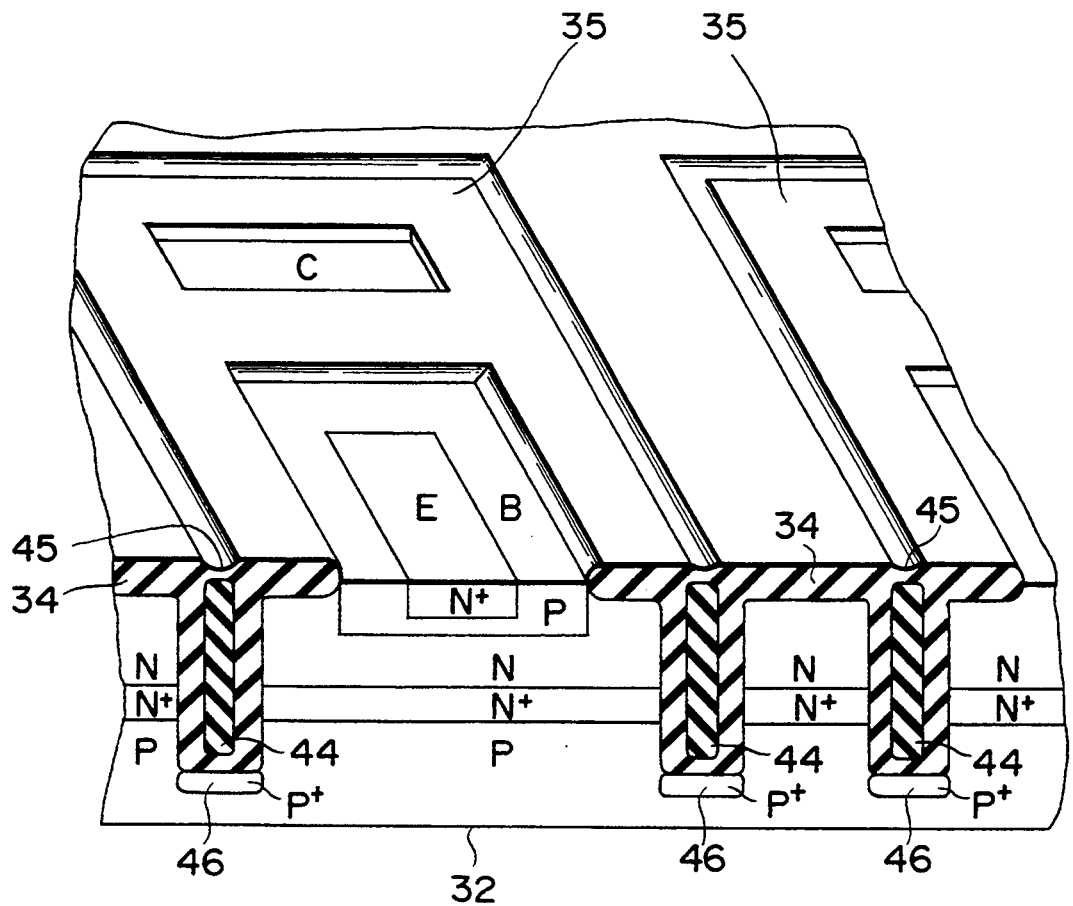
FIG. 3D is a perspective view showing the integrated circuit manufactured by the method according to the present invention.

As shown in FIG. 3D, a polysilicon layer 44 is buried by, e.g., LP-CVD in the trenches 34 in which the oxide films 43 are formed. After the surface of the polysilicon layer 44 is flattened, the exposed surface of the polysilicon layer 44 is oxidized to form a thin capping oxide film 45. A bipolar transistor is formed on each of the plurality of element regions 35 by the known method. Note that reference symbols E, B, and C denote emitter, base, and collector regions of the bipolar transistor, respectively. Although not described above, after formation of the trenches 34, p$^+$-type channel cut regions 46 are respectively formed in the bottoms of the trenches by ion implantation or diffusion.

An attempt performed in the process for achieving the present invention will be described below. In order to optimize the interval $W_{TL}$ between the end of the nonoxide film 40 and the side wall of each trench 34 at a side near the element region 35, the interval $W_{TL}$ was set to be various values, and characteristics of an integrated circuit wherein a plurality of bipolar transistors were formed on the substrate by the above described method were estimated. At this time, the intervals $W_{TL}$ were 0 μm, 1 μm, 2 μm, 3 μm, and 4 μm, the thickness of all the oxide films 43 on the field region 42 was 9,000 Å, and the interval ($W_{TT}$ in FIG. 3B) between the trenches was 3 μm. As estimation items included densities of defects generated at corner portions of the top and bottom of each trench, a stress applied around each trench at room temperature, and a leak voltage generated between elements.

The above defect density was represented as follows. After completion of all element forming steps, the entire surface of the substrate was etched to expose the trench, and defects present on the exposed surface of the trench were selectively etched by wright etching or the like. Thereafter, the number of defects was visually counted using an optical microscope, and the number was represented as a defect density per 1-mm trench length. The stress was measured by Micro-Raman-Spectroscopy, and a maximum stress applied to the bottom of the trench was represented as a measured value. In addition, a leak current was calculated from voltage vs. current characteristics between both the collector electrodes of two transistors, and the leak current was represented as a leak current density between elements at a voltage of 12 V.

Figure 4:
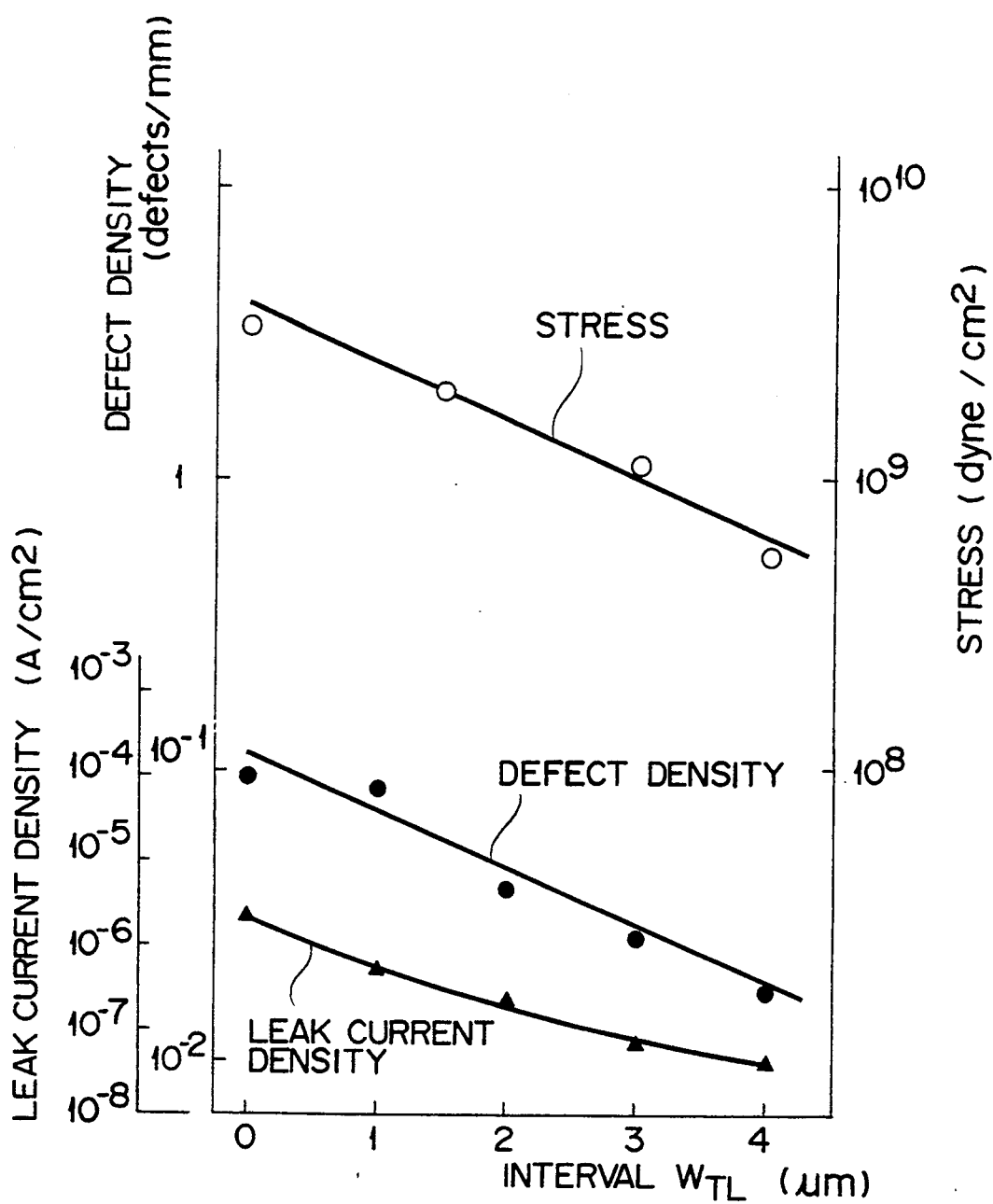
FIG. 4 is a graph for explaining the present invention.

These characteristics are summarized in FIG. 4. The abscissa in FIG. 4 represents the interval $W_{TL}$ (μm), and the ordinate represents the leak current density (A/cm$^2$) between transistors at a voltage of 12 V, the defect density (defects/mm), and the stress (dyne/cm$^2$).

As is apparent from FIG. 4, it is found that, when the interval $W_{TL}$ is gradually decreased from 4 μm to 3 μm, 2 μm, 1 μm, and 0 μm, the stress is gradually increased and the defect density is also increased accordingly. It is found that, with an increase in defect density, leak current density representing a degree of degradation of element isolation characteristics is also increased. Since the leak current density must be kept at a low level, the interval $W_{TL}$ must be increased as much as possible. However, since an increase in interval $W_{TL}$ causes an increase in area of the field region, the interval cannot be excessively increased. Therefore, the minimum interval $W_{TL}$ must be defined.

Figure 5:
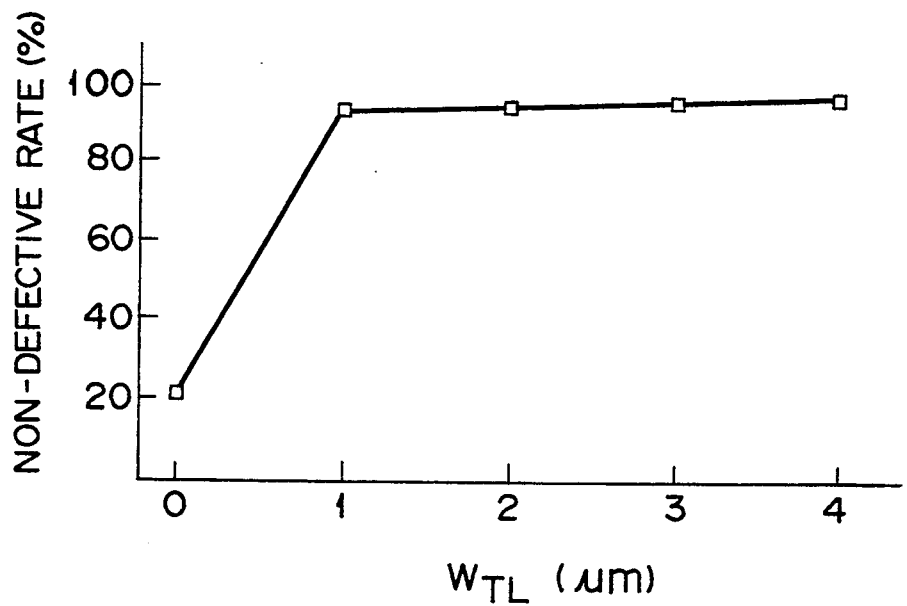
FIG. 5 is a graph for explaining the present invention.

FIG. 5 shows a relationship between the interval $W_{TL}$ and a non-defective rate of transistors in a case wherein 200 to 500 npn transistors are formed on one silicon substrate. In this case, a non-defective element has a collector current $I_{CEO}$ of 1 μA or less when a voltage of 5 V is applied between the collector and emitter electrodes and the base electrode is open. As is apparent from FIG. 5, when the interval $W_{TL}$ is gradually decreased from 4 μm to 3 μm, 2 μm, and 1 μm, a non-defective rate is gradually decreased. When the interval is 0 μm, the non-defective rate is rapidly decreased. Therefore, according to this characteristic, the minimum interval $W_{TL}$ is given as 1 μm.

Figure 6:
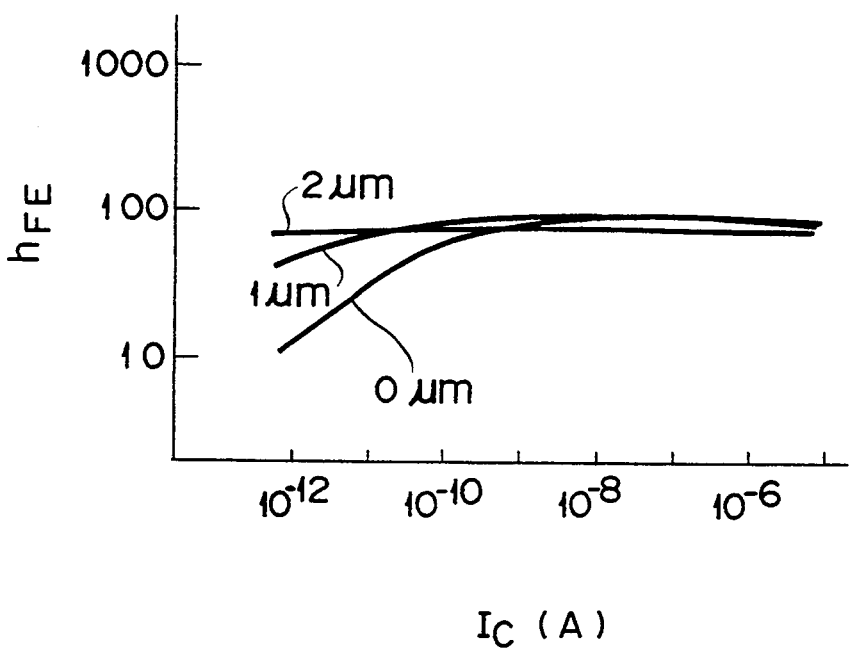
FIG. 6 is a graph for explaining the present invention.

FIG. 6 shows collector current (Ic) vs. current amplification factor (h$_{FE}$) characteristics of an npn transistor formed on a silicon substrate using the interval $W_{TL}$ as a parameter. That is, the abscissa represents the collector current Ic (A), and the ordinate represents the current amplification factor $h_{FE}$. Note that the $h_{FE}$ falls within the range of 80 to 100. As is apparent from FIG. 6, when the interval $W_{TL}$ is smaller than 2 μm, $h_{FE}$ is decreased in a region having a low collector current. However, when the interval $W_{TL}$ is 2 μm or more, a decrease in $h_{FE}$ is not conspicuous in the region having the low collector current, and the $h_{FE}$ falls within a design value. Therefore, according to the characteristics, the minimum interval $W_{TL}$ is given as 2 μm. According to the above result, when bipolar transistors are formed on element regions, the interval $W_{TL}$ must be 2 μm or more in order to obtain the sufficiently satisfactory characteristics of the transistors.

In a bipolar transistor, the thickness of the oxide film formed on the field region and the side walls of the trench by wet oxidation is generally designed to be less than 9,000 Å. When the silicon substrate is generally oxidized, the oxide film extends outside the surface of the substrate by about 45% of its total thickness and extends inside the surface of the substrate by about 55% of its total thickness. Therefore, the trench is designed to have the width $W_T$ of 1 μm as described above, and an oxide film having a thickness of 8,000 Å is formed by wet oxidation. As a result, an oxide film having a thickness of 8,000 Å×0.45, i.e., 3,600 Å is formed on the first surface of the trench. Using an oxide film having the above thickness, the trench is not buried by only the oxide film. Therefore, a polysilicon layer can be formed in the trench.

Another embodiment of the present invention will be described below.

In this embodiment, each of trenches 34 has a width $W_T$ of 1 to 2 μm and a depth $L_T$ of about 5 μm, an interval $W_{TL}$ between the end of a nonoxide film 40 and the side wall of the trench 34 is at least 2 μm or more, and an oxide film 43 has a thickness of less than 9,000 Å, e.g., 8,000 Å. In the field of integrated circuits, the size of an element is generally reduced by a technique called shrinkage. In this technique, the integrated circuit is designed to have sizes obtained by multiplying a predetermined magnification, e.g., 0.8 or 0.7, by a standard size, and all the sizes are reduced proportionally to the magnification.

Therefore, in the embodiment wherein shrinkage is performed at a magnification of 0-8 for the integrated circuit designed and manufactured by the above embodiment in FIG. 3, each trench 34 has a width $W_T$ of 0.8 to 1.6 μm and a depth $L_T$ of about 4 μm, an interval $W_{TL}$ between the end of a nonoxide film 40 and the side wall of a trench 34 is at least 1.6 μm or more, and the thickness of an oxide film 43 is designed to have less than 7,200 Å, e.g., 7,000 Å. In addition, in the embodiment wherein shrinkage is performed at a magnification of 0.7 for the integrated circuit designed and manufactured by the above embodiment in FIG. 3, each trench 34 has a width $W_T$ of 0.7 to 1.4 μm and a depth $L_T$ of about 3.5 μm, an interval $W_{TL}$ between the end of a nonoxide film 40 and the side wall of a trench 34 is at least 1.4 μm or more, and the thickness of an oxide film 43 is designed to have less than 6,300 Å, e.g., 6,000 Å.

Note that the present invention is not limited to the above embodiments and can be variously changed. For example, in the embodiment in FIG. 3, although a case wherein oxide films are simultaneously formed inside the trench and on the upper surface of the field region has been described above, the oxide films may be independently formed inside the trench and on the upper surface of the field region.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device comprising the steps of:

anisotropic etching a monocrystalline silicon substrate to form a plurality of trenches therein each having a width of 1 to 2 μm and surrounding each of a plurality of element forming regions wherein a bipolar transistor is formed, said trenches being positioned at intervals of approximately 3 μm;

forming a nonoxide film on said element forming regions with an interval between an end portion of said nonoxide film and a side wall of each said trench at a side thereof near said element forming regions of said trenches being approximately 2 μm;

forming an oxide film having a film thickness no greater than 9,000 Å on a surface of said substrate including an inside portion of each of said trenches using said nonoxide film as a mask, with each of said trenches not being completely filled by said oxide film;

completely filling said trenches with a polysilicon layer having an exposed portion; and oxidizing said exposed portion of said polysilicon layer.

2. A method of manufacturing a semiconductor device comprising the steps of:

anisotropic etching a monocrystalline silicon substrate to form a plurality of trenches therein each having a width of 0.8 to 1.6 μm and surrounding each of a plurality of element forming regions wherein a bipolar transistor is formed, said trenches being positioned at intervals of approximately 2.4 μm;

forming a nonoxide film on said element forming regions with an interval between an end portion of said nonoxide film and a side wall of each said trench at a side thereof near said element forming regions of said trenches being approximately 1.6 μm;

forming an oxide film having a film thickness no greater than 7,200 Å on a surface of said substrate including an inside portion of each of said trenches using said nonoxide film as a mask, with each of said trenches not being completely filled by said oxide film;

completely filling said trenches with a polysilicon layer having an exposed portion; and oxidizing said exposed portion of said polysilicon layer.

3. A method of manufacturing a semiconductor device comprising the steps of:

anisotropic etching a monocrystalline silicon substrate to form a plurality of trenches therein each having a width of 0.7 to 1.4 μm and surrounding each of a plurality of element forming regions wherein a bipolar transistor is formed, said trenches being positioned at intervals of approximately 2.1 μm;

forming a nonoxide film on said element forming regions with an interval between an end portion of said nonoxide film and a side wall of each said trenches at a side thereof near said element forming regions of said trenches being approximately 1.4 μm;

forming an oxide film having a film thickness no greater than 6,300 Å on a surface of said substrate including an inside portion of each of said trenches using said nonoxide film as a mask, with each of said trenches not being completely filled by said oxide film;

completely filling said trenches with a polysilicon layer having an exposed portion; and oxidizing said exposed portion of said polysilicon layer.

* * * * *